US008125239B2

(12) United States Patent  
Rittmann

(10) Patent No.: US 8,125,239 B2  
(45) Date of Patent: Feb. 28, 2012

(54) SELF CALIBRATING CURRENT SENSOR

(75) Inventor: Kenneth W. Rittmann, Kokomo, IN (US)

(73) Assignee: Functional Devices, Inc., Russiaville, IN (US)

( * ) Notice: Subject to any disclaimer, the term of this patent is extended or adjusted under 35 U.S.C. 154(b) by 436 days.

(21) Appl. No.: 12/381,782

(22) Filed: Mar. 17, 2009

(65) Prior Publication Data

US 2009/0284250 A1    Nov. 19, 2009

Related U.S. Application Data

(60) Provisional application No. 61/069,683, filed on Mar. 17, 2008.

(51) Int. Cl.  
*G01R 31/34* (2006.01)
(52) U.S. Cl. .................................................. 324/765.01
(58) Field of Classification Search .................. None  
See application file for complete search history.

(56) References Cited

U.S. PATENT DOCUMENTS 7,545,135 B2 * 6/2009 Holle et al. ............... 324/76.11

* cited by examiner

*Primary Examiner* — Roberto Velez  
(74) *Attorney, Agent, or Firm* — Ice Miller LLP

(57) ABSTRACT

A self-calibrating current sensor for sensing the state of the current passing through a load line enclosed within a housing comprises a sensor disposed adjacent the load line for sensing a current passing through the load line, the sensor having an output at which a signal indicative of the level of current passing through the load line is present, the sensor being positioned with the housing, a binary input circuit configured to generate at least one binary signal, the binary input circuit being configured to change the level of the at least one binary signal without the need of opening the housing, and a controller circuit having a first input coupled to the output of the sensor for receiving the signal indicative of the level passing through the supply line and having a second input coupled to the binary input circuit for receiving the at least one binary signal, the controller being configured to provide a signal indicative of the status of the current in the load line on an output. A method of calibrating a current sensor is also provided.

13 Claims, 4 Drawing Sheets

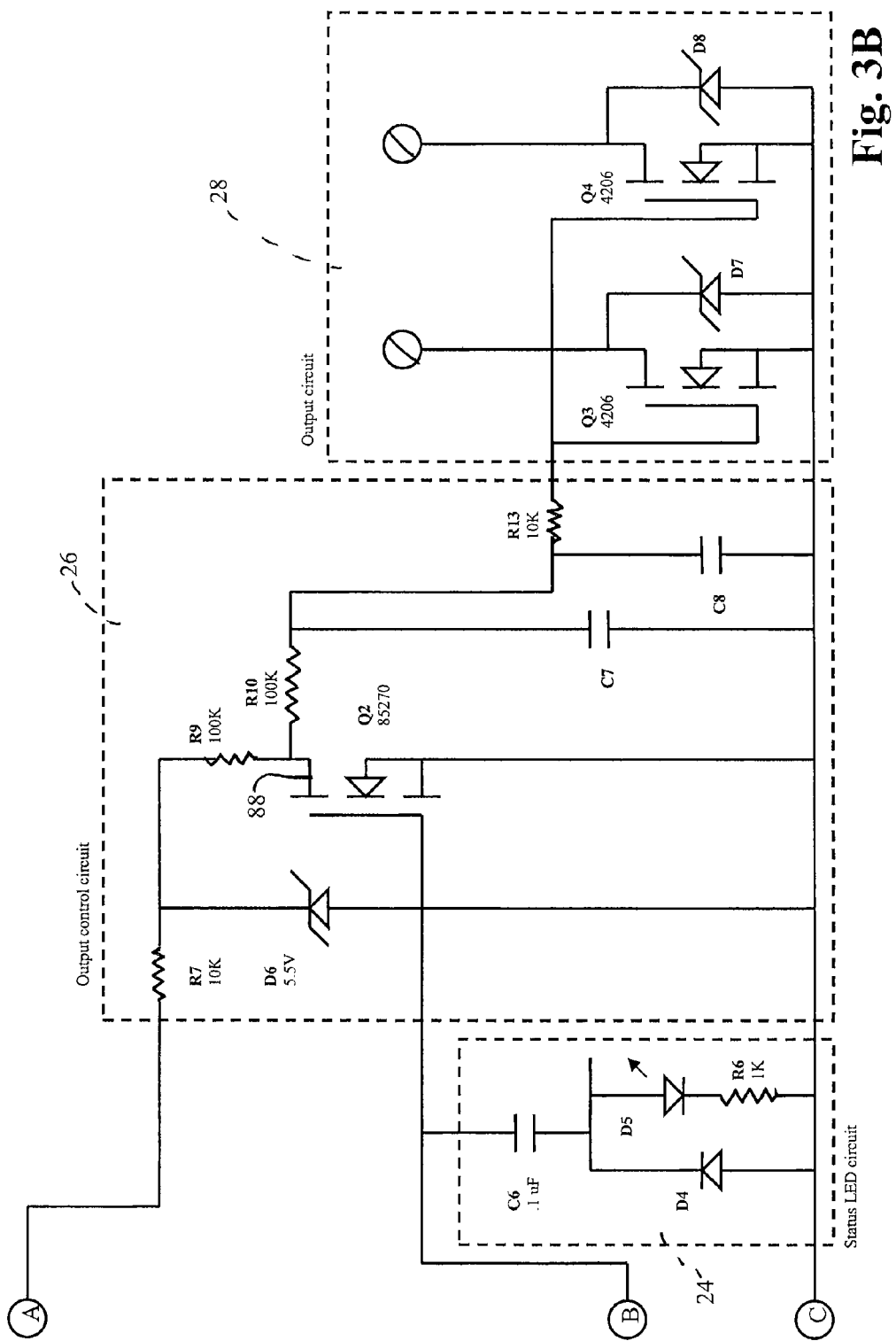

SELF CALIBRATING CURRENT SENSOR

BACKGROUND AND SUMMARY

This application claims the benefit of U.S. Provisional Application Ser. No. 61/069,683 filed Mar. 17, 2008, the disclosure of which is hereby incorporated herein by this reference.

This disclosure relates to current sensing devices and more particularly to current sensing devices that self calibrate upon receipt of a calibration signal.

Many electrical or electronic devices require that the current input or output be sensed and/or controlled for proper operation. Among the electrical applications wherein current sensing is important are applications in which a motor is utilized.

One previous method of monitoring a motor for over current, correct current, or under current conditions, involved installing a current sensor on the load wires feeding the motor. When a desired motor current condition occurred, the current sensors supplied a binary or analog output that could be used by another circuit or another device to simply monitor the condition or to take some action based upon the output. An analog output from a current sensor could be used by another device to determine current conditions as mentioned above. A binary current may be used to monitor two separate conditions. Unlike analog outputs, the binary output of the current sensor relies upon a threshold, either fixed or adjustable, in order to discern between separate conditions.

Analog output current sensors are typically more expensive than binary output current sensors, they rely on more expensive other circuits or devices to interpret their output and therefore may be less desirable.

Binary output current sensors with fixed thresholds are less desirable than adjustable threshold current sensors if the correct current condition of a motor is not near the same level as the fixed threshold. One drawback of fixed threshold binary output current sensors is that when the correct current condition of a motor is not near the same level as the fixed threshold, a simple yes/no condition is all that can be utilized. However, over current, correct current, and under current conditions can be indicated by the binary output of a fixed threshold current sensor if the threshold of the current sensor is near the correct current condition of a motor. Therefore, in order to obtain an indication of over current, under current, and correct current conditions, utilizing fixed threshold current sensors, it would be necessary to be order specific fixed threshold current sensors with the appropriate threshold for individual applications which might require users to carry a large inventory of fixed threshold current sensors with varying threshold values.

Binary output current sensors with adjustable thresholds can be adjusted to almost any level within the range of the current sensor making them very universal. One current sensor could be used for varying current sized motors. A yes/no condition or over current, correct current, and under current conditions can be utilized with the adjustable current sensor.

When monitoring a motor, it may be necessary to engage a sensing device such as a adjustable threshold binary output current sensor in proximity of the current carrying wires feeding the motor. Typically the motor starter box is the best place to access the current carrying wires and for installing the current sensing device. The National Electric Codes (the US code book for electrical installations) requires a motor starter box for most applications utilizing motors. The motor starter box typically includes a relay, over current protection, and other devices or circuits all of which are enclosed in a housing to protect outside agencies from high voltage or shock hazard conditions.

There is typically room within such a motor starter box to install a current sensing device. That device, once installed, is within a high voltage or shock hazard environment. Some existing designs of current sensors require either an unsafe code violation, or an inconvenient removal of the device from the motor control box while power is off, powering the device some other way, pressing a reset button, powering down, putting the device back in the cabinet and closing the door before powering up the motor in order to calibrate the device.

The National Electric Code prohibits having a motor control cabinet door open while the motor is running. Existing sensing products require that the motor controller cabinet be open to allow access to the sensing device in order to initiate a re-calibration sequence (IE: press a button).

One example of a prior art current sensor for a motor application is a Functional Devices, Inc. model RIBXGTA. This device can easily be clipped around or near the current carrying wire(s) within a motor starter box. The RIBXGTA current sensor includes an accessible potentiometer intended to be adjusted while the motor is running to allow manual setting of its threshold. The threshold can be set at a level that would provide a yes/no output or at a level that the output could represent over current, correct current, or under current condition. Placement of the RIBXGTA current sensor in the motor starter box mandates that the cover of the motor starter box be open while the motor is powered up and operating in order to access the adjustment device and set the appropriate threshold. Doing so with the cover open exposes one to high voltage, creates a shock hazard and is not allowed by the National Electrical Code.

Another example of a current sensor for motor applications is Functional Devices, Inc. model RIBXLRA configured for placement of the current sensing device within the motor starter box, while locating the mechanism to make adjustments to the threshold in a separate device that is mounted to the outside of the motor starter box. Such an arrangement works around the flaw of the aforementioned Functional Devices, Inc. model RIBXGTA in that the motor may be running with the motor starter box closed while an adjustment is made to the threshold.

Other current sensors exist that work around the problem of having to adjust a threshold in a shock hazard environment by having the adjustable current sensor self calibrate. One such prior art current sensor is Veris model H10F. During calibration, power must be applied to the H10F current sensor then a button must be pressed to tell the unit to go thru a self calibration mode. One disadvantage of the H10F current sensor is that it must be powered up, either before installing the unit in the motor starter, or after installing the unit in the motor starter. The inconvenience of having to have the H10F current sensor out of the motor starter box, powering it up, pushing the button, then installing the unit is inherent to such a device. The only other option is to install the H10F current sensor in the motor starter box, leave the motor starter box open, power up the unit, then push the button in a shock hazard condition. Again the latter option does not comply with the National Electrical Code standards.

The disclosed self-calibrating current sensor accepts a binary input from a source without creating a shock hazard for an operator thereby addressing some shortcomings of prior devices.

The disclosed self-calibrating current sensor accepts and stores a command to re-calibrate while in a safe, powered down mode. A user may in one embodiment flip a switch on the device while it is still inside the control cabinet with power turned off. In another embodiment a self-calibrating current sensor accepts a binary change from an outside source, such as a controller electrically coupled to the device, and begins a recalibration process upon a change in state of the binary signal received.

In one embodiment of the disclosed self-calibrating current sensor, the device accepts and remembers a command to initiate a calibration sequence while in a safe, powered down condition. Upon power up, the device will recognize the command, wait a prescribed time period then automatically re-calibrate. In another embodiment of the disclosed self-calibrating current sensor, the device accepts a command in the potential shock hazard powered up state without exposing an operator to such a potential shock hazard by accepting a binary input from a device such as a controller.

According to one aspect of the disclosure a self-calibrating current sensor for sensing the state of the current passing through a load line enclosed within a housing comprises a sensor, a binary input circuit, and a controller circuit. The sensor is disposed adjacent the load line for sensing a current passing through the load line and has an output at which a signal indicative of the level of current passing through the load line is present. The sensor is positioned within the housing. The binary input circuit is configured to generate at least one binary signal and is configured to change the level of the at least one binary signal without the need of opening the housing. The controller circuit has a first input coupled to the output of the sensor for receiving the signal indicative of the level passing through the supply line and a second input coupled to the binary input circuit for receiving the at least one binary signal. The controller is configured to provide a signal indicative of the status of the current in the load line on an output.

According to another aspect of the disclosure, a method of sensing a current flowing through a load wire disposed at least in part within an housing includes a providing a self calibrating current sensor step, a positioning a sensor component step, a powering up the self-calibrating current sensor step, a generating an initiate calibration signal step, a calibrating the self-calibrating current sensor step, a comparing the signal indicative of the level of current in the load line to the stored normal operating current step and a generating a fault signal step. The provided self-calibrating current sensor includes an input circuit for providing an initiate calibration signal to initiate calibration of the self-calibrating current sensor, a sensor component coupled to the load line in a manner to allow the sensor to generate a signal indicative of the level of the current in the load line and a controller for receiving the signal indicative of the level of the current in the load line and storing the same and for receiving the initiate calibration signal. The positioned sensor component of the provided self-calibrating current sensor is positioned within the housing for sensing the current flowing through the load wire. The initiate calibration signal is generated without opening the housing. The calibrating the self-calibrating current sensor step includes storing a normal operating current following generation of the calibration signal. The comparing the signal indicative of the level of current in the load line to the stored normal operating current step is performed following the calibrating step. The generated fault signal is available without opening the housing and is generated when the signal indicative of the level of current in the load line is outside a selected range of the stored normal operating current.

Additional features and advantages of the invention will become apparent to those skilled in the art upon consideration of the following detailed description of a preferred embodiment exemplifying the best mode of carrying out the invention as presently perceived.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
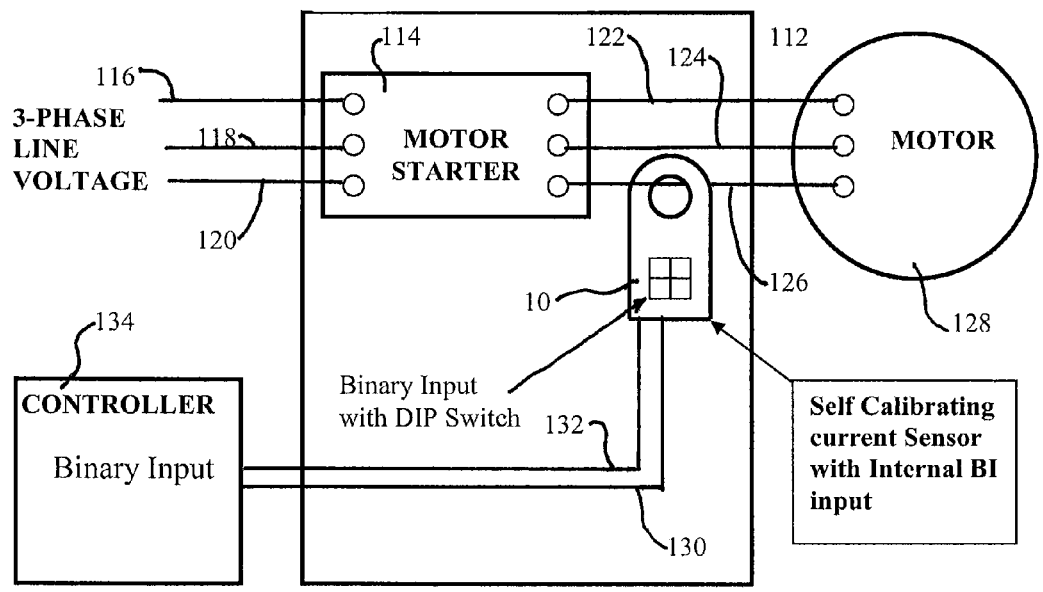
FIG. 1 is a block diagram of one embodiment of a self-calibrating current sensor with an internal binary input in a motor application that sends a binary output to a controller.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present invention includes any alterations and modifications to the illustrated embodiments and includes further applications of the principles of the disclosure as would normally occur to one skilled in the art to which this invention pertains.

While the embodiments of the self-calibrating current sensor 10, 210 are illustrated and described herein as being utilized in an application utilizing a motor wherein the load current delivered to the motor is sensed, it is within the scope of the disclosure for the self-calibrating current sensor to be used in other applications wherein it is desirable to sense whether a current is within a desired range of a desired operating current. Nothing in this disclosure, should be interpreted as requiring the utilization of the disclosed self-calibrating current sensor with an application utilizing a motor, unless specifically indicated otherwise.

As shown for example in FIG. 1, one embodiment of the disclosed self-calibrating current sensor 10 is configured for mounting within a motor starter housing 112 along with a motor starter 114. The motor starter 114 receives three phase line voltage from an external source which is coupled by lines 116, 118, 120 which extend through the housing 112 and are coupled within the interior of the housing 112 to the motor starter 114. The motor starter 114 outputs motor drive signals on load lines 122, 124, 126 that pass through the housing 112 and are coupled to respective terminals of the motor 128. The self-calibrating current sensor 10 is positioned relative to one of the load lines (illustratively surrounding load line 126) in a manner to allow current passing through the load line 126 to be sensed by the self-calibrating current sensor 10. The self-calibrating current sensor 10 is configured to include an internal binary input (illustratively two binary input DIP switches) configured to set a differential value and to initiate calibration or recalibration of the current sensor 10. The self-calibrating current sensor 10 provides a signal on its output that is conveyed via output lines 130, 132 which extend through the housing 112 and are coupled to a controller 134 configured to receive a binary input.

Figure 2:
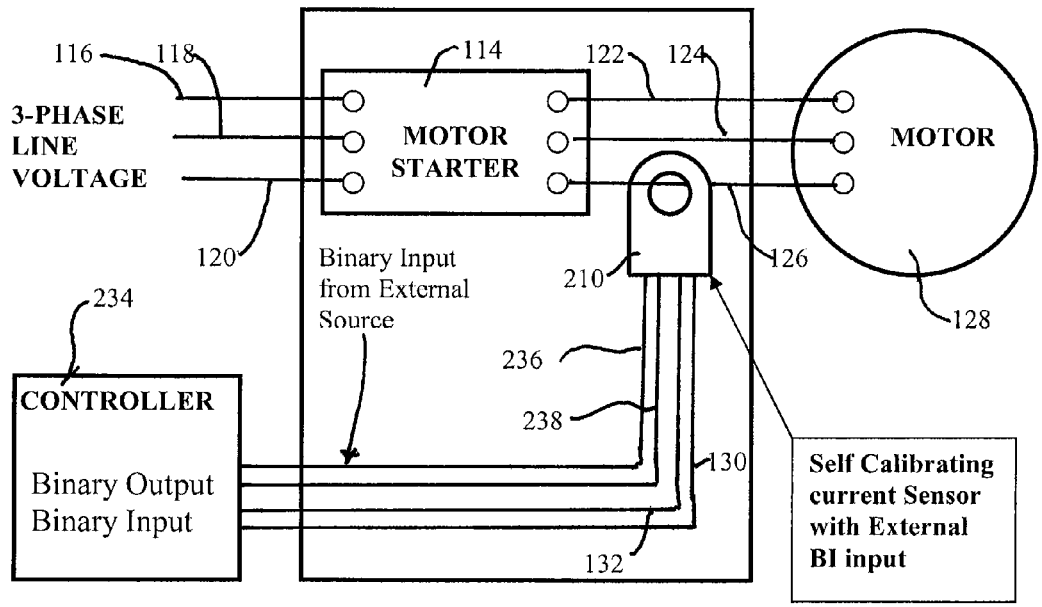
FIG. 2 is a block diagram of an alternative embodiment of a self-calibrating current sensor in a motor application that receives a binary input from an external device located outside of a motor starter box.

As shown for example in FIG. 2, one embodiment of the disclosed self-calibrating current sensor 210 is configured for mounting within a motor starter housing 112 along with a motor starter 114. The motor starter 114 receives three phase line voltage from an external source which is coupled by lines 116, 118, 120 which extend through the housing 112 and are coupled within the interior of the housing 112 to the motor starter 114. The motor starter 114 outputs motor drive signals on load lines 122, 124, 126 that pass through the housing 112 and are coupled to respective terminals of the motor 128. The self-calibrating current sensor 210 is positioned relative to one of the load lines (illustratively surrounding load line 126) in a manner to allow current passing through the load line 126 to be sensed by the self-calibrating current sensor 210. The self-calibrating current sensor 210 is configured to receive an external binary input (illustratively via lines 236, 238 extending through the housing 112 and coupled to the binary output terminal of a controller 234) configured to initiate calibration or recalibration of the self-calibrating current sensor 210. The self-calibrating current sensor 210 provides a signal on its output that is conveyed via output lines 130, 132 which extend through the housing 112 and are coupled to the binary input terminals of the controller 234.

Figure 3A:
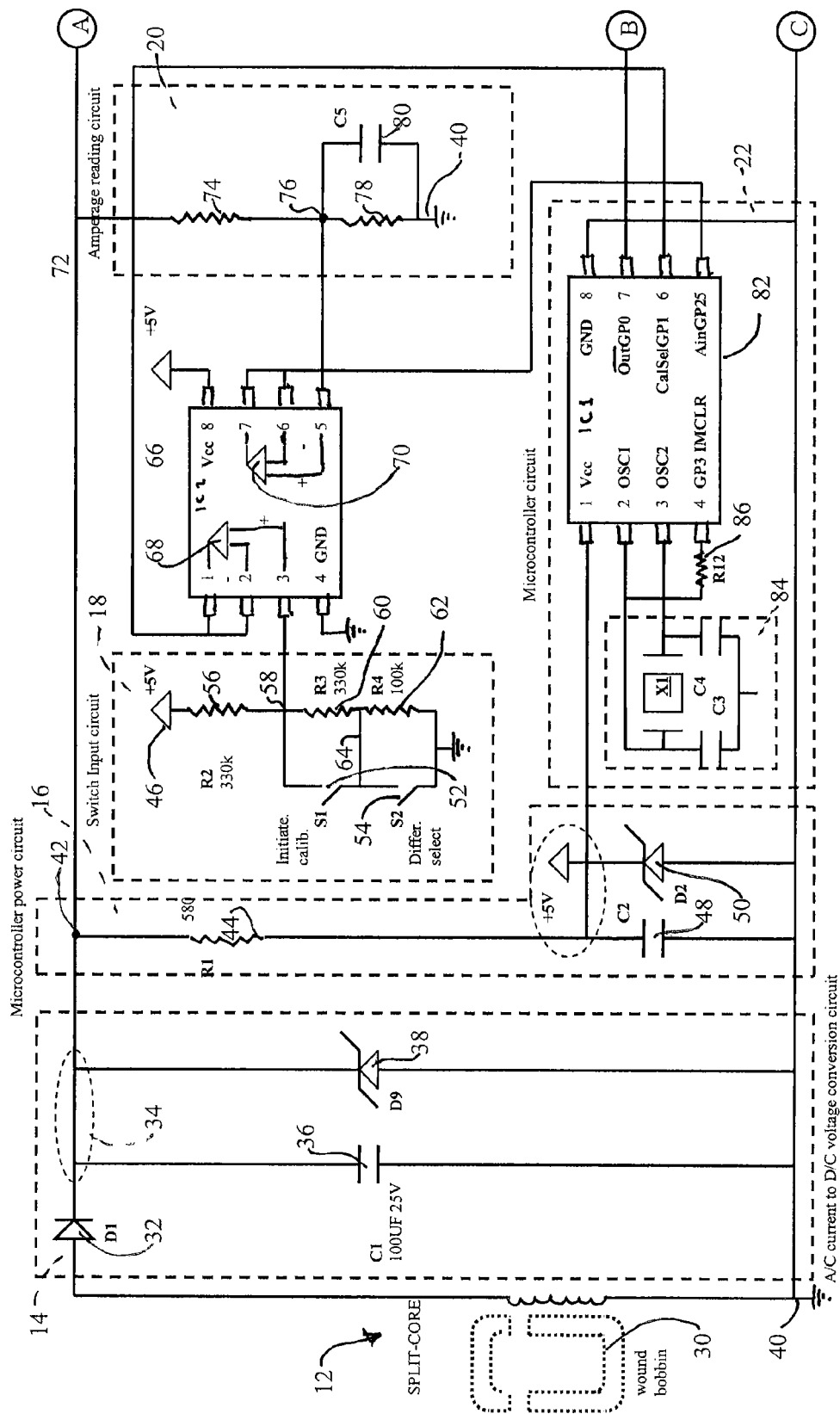
FIG. 3 is a schematic diagram of one embodiment of a self-calibrating current sensor.

As shown for example, in FIG. 3, one embodiment of the disclosed self-calibrating current sensor 10 is implemented using integrated circuits and discrete electronic components. While shown as being implemented using specific discrete components and integrated circuits, it is within the scope of the disclosure for the self-calibrating current sensor 10 to be implemented utilizing, alternative discrete components and/or integrated circuits, one or more application specific integrated circuits, and/or other integrated circuits and/or discrete components either alone or in combination with the disclosed components. Also, while not separately described, the self-calibrating current sensor 210 is very similar to the illustrated current sensor 10 except that the switches illustrated in the digital input circuit are replaced by inputs from a controller or other external device in a standard manner.

On a block diagram level, the disclosed self-calibrating current sensor 10 includes a sensor 12 for detecting the presence of a current in a conductor, an AC current to DC current converter 14, a microcontroller power circuit 16, a binary input circuit 18, an amperage reading circuit 20, a microcontroller circuit 22, a status LED circuit 24, an output control circuit 26 and an output circuit 28. The sensor 12 may be a device communicating with a conductor that is capable of sensing the presence of a current in the conductor and generating a signal indicative of the current's presence and level. In one embodiment, the sensor 12 is a split core transformer with a wound bobbin (TX1) 30 inductively coupled to a conductor so that current flowing through the conductor induces a current to flow from the transformer 30 that is proportional to the current in the conductor. Other transformers, including solid core transformers, may be utilized as a sensor 12 within the scope of the disclosure. Additionally, other sensors may be utilized, such as, for example, Hall-effect sensors.

Since the disclosed current sensor 10 may be used in an application utilizing an AC motor which is driven by alternating current, the current output by the illustrated sensor 12 is also alternating current. Therefore, the disclosed self-calibrating current sensor 10 includes an AC current to DC current converter 14 coupled to the output of the inductive sensor 12. The AC current to DC current converter 14 converts the secondary current of the current transformer 30 to a proportional D/C voltage (V1) to be read and stored as the normal operating current and to power the electronic components of the device 10. In the illustrated embodiment, the AC current to DC current converter 14 includes a rectifying diode (D1) 32 coupled between the output of the sensor and an output node 34 of the AC current to DC current converter 14 and a capacitor (C1) 36 and zenor diode (D9) 38 coupled between the output node 34 and ground 40 to smooth the output signal.

The converted DC signal (V1) output by the AC current to DC current converter 14 will be proportional to the current flowing through the conductor to which the sensor 12 is inductively coupled and thus may be a variable current. Since the illustrated self-calibrating current sensor 10 utilizes integrated circuits that require a relatively steady supply voltage to power the integrated circuits, the output (V1) on the output node 34 of the AC current to DC current converter 14 is coupled to the input node 42 of the microcontroller power circuit 16 (a bit of a misnomer since the circuit also powers other electronic components in addition to the microcontroller integrated circuit 82) which is configured to provide a relatively steady DC voltage for driving various internal electronic components. In the illustrated embodiment, the microcontroller power circuit 16 draws minimal current from the signal V1 output by the AC current to DC current converter 14 to create a relatively steady supply voltage (5V DC) to power the Microcontroller integrated circuit 82 (IC1) of the microcontroller circuit 22, an Operational Amplifier ("Op-Amp") integrated circuit (IC2) (not included in any of the block circuit components since it is configured to act as a buffer for providing proper input signals the micro-controller), and to set a reference voltage on the binary input circuit 18. In the illustrated embodiment, the microcontroller power circuit 16 includes a resistor (R1) 44 coupled between the input node 42 and a supply voltage output node 46. A capacitor (C2) 48 and zenor diode (D2) 50 are coupled in parallel between the supply voltage output node 46 and the ground node 40.

In the illustrated embodiment, wherein two DIP switches are provided on the self-calibrating current sensor 10, the binary input circuit 18 provides four levels of voltage that represent the four possible combinations of switch positions. In the external binary input configuration of the self-calibrating current sensor 210 two separate signals provide the binary input. In the illustrated embodiment, one switch of the DIP switches, the initiate calibration switch 52, is designated as the switch to be opened or closed in order to initiate a calibration sequence. The other DIP switch, the differential selection switch 54, is designated as the switch that assumes one position (opened or closed) when the current sensor 10 is to provide a fault signal when the sensed current is outside a first range (illustratively 15% different than the operating current) and that assumes a second position when the current sensor 10 is to provide a fault signal when the sensed current is outside a second range (illustratively 25% different than the operating current). In the illustrated embodiment, the differential selection switch (S2) 54 sets the upper and lower thresholds to 15% if it is on and 25% if it is off. This selection can be made at any time.

In the illustrated embodiment, a switch configurable voltage divider circuit is provided with a first resistor (R2) 56 being coupled between a reference voltage (illustratively 5V) available at output node 46 of the power circuit 16 and an output node 58 coupled through the buffer circuitry (illustratively a unity gain Operational amplifier 68) to the calibration select GP2 pin of the microcontroller integrated circuit 82. A second resistor (R3) 60 and the initiate calibration switch (S1) 52 are coupled in parallel between the output node 58 and an intermediate node 64. The third resistor (R4) 62 and the differential select switch (S2) 54 are coupled in parallel between the intermediate node 64 and ground 40. Thus, a switch configurable voltage divider is formed, as shown, for example, in FIG. 3.

In one embodiment the first resistor (R2) 56 and second resistor (R3) 60 are of equal resistive value (illustratively 330 kOhms) and the third resistor (R4) 62 is of a lower resistive value (illustratively 100 kOhms). When the initiate calibration switch (S1) 52 and the differential select switch (S2) 54 are both closed, the output node 58 is coupled to ground and provides a 0 volt signal as the entire reference voltage potential drops across the first resistor (R2) 56. When the initiate calibration switch (S1) 52 is open and the differential select switch (S2) 54 is closed, a voltage divider is formed including the first resistor (R2) 56 (330 kOhm) and the second resistor (R3) 60 (330 kOhm) so that the signal present on the output node 58 is one half of the reference voltage, which in the illustrated embodiment would be 2.5V (5V(330/(330+330))). When the initiate calibration switch (S1) 52 is closed and the differential select switch (S2) 54 is open, a voltage divider is formed including the first resistor (R2) 56 (330 kOhm) and the third resistor (R4) 62 (100 kOhm) so that the signal present on the output node 58 is 10/43 of the reference voltage which in the illustrated embodiment would be approximately 1.16V (5V(100/(330+1:00))). When the initiate calibration switch (S1) 52 and the differential select switch (S2) 54 are both open, a voltage divider is formed including the first resistor (R2) 56 (330 kOhm) and the combination of the second resistor (R3) 60 (330 kOhm) and third resistor (R4) 62 (100 kOhm) so that the signal present on the output node 58 is 43/76 of the reference voltage which in the illustrated embodiment would be approximately 2.83V (5V((330+100)/(330+(330+100)))). These voltages are utilized to establish the threshold levels and to trigger recalibration of the sensor 10.

As mentioned previously, the CalSel GP1 input (pin 6) of the microcontroller integrated circuit 82 in the illustrated embodiment requires a buffered signal for proper operation, therefore, the output voltage signal present on the output node 58 of the binary input circuit 18 is buffered using a unity gain operational amplifier 68 of an operational amplifier integrated circuit (IC2) 66 before being sent to the microcontroller integrated circuit 82. In the illustrated embodiment, the output node 58 of the binary input circuit 18 is coupled to the non-inverting input of the first operational amplifier 68 of the first IC 66. The output of the operational amplifier 68 is fed back to the inverting input and is coupled to the CalSel GP1 input (pin 6) of the microcontroller integrated circuit 82.

In the illustrated embodiment, operational amplifier integrated circuit (IC2) 66 is an operational amplifier such as the MCP6041/2/3/4 family of operational amplifiers from Microchip Technology, Inc. In the illustrated embodiment, the operational amplifier integrated circuit (IC2) 66 is an MCP6042 dual configuration operation amplifier integrated circuit. Such operational amplifiers operate with a single supply voltage as low as 1.4 V, while drawing less than 1 μA (max) of quiescent current per amplifier. These devices are also designed to support rail-to-rail input and output operation. In one embodiment, the operational amplifier has a typical gain bandwidth product of 14 kHz (typ) and are unity gain stable making such operational amplifiers well suited for buffering applications.

Those skilled in the art will recognize that different microcontrollers may accept different input types and that appropriate circuitry may be provided to convert signal to the appropriate type for acceptance by the selected microcontroller within the scope of the disclosure.

The DC voltage output (V1) present on the output node 34 of the AC current to DC current converter 14 is coupled to the input node 72 of the amperage reading circuit 20. The amperage reading circuit 20 shifts the level of the DC voltage output (V1) of the AC current to DC current converter 14 to lower proportional level that fits within the range of the microcontroller integrated circuit 82 analog input Ain GP2. In the illustrated embodiment, a voltage divider is formed including a resistor (R5) 74 coupled between the input node 72 and an output node 76 of the amperage reading circuit 20 and a resistor (R6) 78 coupled in parallel with a capacitor (C5) 80 between the output node 76 and ground 40. The output present on the output node 76 of the amperage reading circuit 20 is buffered utilizing a second unity gain operational amplifier 70 of the second integrated circuit 66.

In the illustrated embodiment, the output node 76 of the amperage reading circuit 20 is coupled to the non-inverting input of the second operational amplifier 70. The output of the operational amplifier 70 is fed back to the inverting input and is coupled to Ain GP2 pin of the microcontroller integrated circuit 82. Thus a buffered signal proportional to the current flowing through the load conductor is present on the analog input Ain GP2 (pin 5) of the microcontroller integrated circuit 82.

The illustrated microcontroller circuit 22, includes a microcontroller integrated circuit (IC1) 82, a crystal clock circuit 84 and a resistor (RI2) 86. The microcontroller integrated circuit provides memory for storing values of the switch positions and the normal operating current. In one embodiment, the memory is implemented utilizing an 8-Pin 8-Bit CMOS Microcontroller. The a microcontroller integrated circuit (IC1) 82 is powered by having its Vcc pin (pin 1) coupled to the regulated power supply present on the output node 46 of the power circuit 16 and its ground pin (pin 8) coupled to ground 40.

The crystal clock circuit 84 provides clock signals for the first oscillator input OSC1 (pin 2) and the second oscillator input OSC2 (pin 3) of the microcontroller integrated circuit 82. The microcontroller integrated circuit (IC1) 82 reads the binary input circuit 18 to determine the position of the switches 52, 54, reads the amperage reading circuit 20 to determine the level of the current in the load wire placed through the split core transformer with wound bobbin (TX1) 30, and creates a signal that operates the status LED circuit 24 and the output control circuit 26.

In the illustrated embodiment, the microcontroller integrated circuit (IC1) 82 stores the last state of the initiate calibration switch 52 of the binary input circuit 18. The illustrated embodiment of the self-calibrating current sensor 10 utilizes the signal from the crystal clock 84 to establish a debounce delay time which is utilized to determine whether any sensed change in the state of the initiate calibration switch 52 may have been unintentional. If a detected change in the state of the initiate calibration switch 52 from the last known state persists longer than the debounce delay time, the microcontroller integrated circuit (IC1) 82 will initiate a calibration process. The process starts with a stabilization delay which is imposed to allow the load it is to monitor to stabilize. In one embodiment of the disclosed self-calibrating current sensor 10, the stabilization delay is approximately thirty seconds. Those skilled in the art will recognize that the stabilization delay may take on longer or shorter values within the scope of the disclosure. The appropriate stabilization delay will be selected based on the operating parameters of the application in which the current is being sensed.

After receiving an initiation calibration signal and following the stabilization delay, the microcontroller integrated circuit (IC1) 82 reads the signal present on the output node 76 of the amperage reading circuit, which signal is proportional to the current flowing through the load conductor being monitored. The value of the signal present on the output node of the amperage reading circuit 20 is and stored as the normal operating current in memory present on the microcontroller integrated circuit 82.

From this time forward, the microcontroller integrated circuit (IC1) 82 will compare the Amperage reading to determine if it is within the selected range (illustratively either 15% or 25%) from the stored normal operating current value. If the Amperage is within the range, the output will be turned on. If it is out of range, the output will be turned off as described below.

In the illustrated embodiment, the microcontroller integrated circuit (IC1) 82 creates a composite signal present on output OutGP0 (pin 7) pin of the microcontroller integrated circuit 82. This composite output signal contains positive edges of short duration that activate the status LED circuit 24 in a winking pattern depending on the number of positive edges. If the overall signal is at a low level, the output control circuit 26 will detect this because the composite signal is coupled to the gate of a transistor and will eliminate the gate drive and provide a constant high level to activate the output circuit 28. Conversely, if the overall signal is at a high level, the output control circuit will detect this and provide a constant low level to deactivate the output circuit 28. In an alternative embodiment utilizing a microcontroller with more output pins, separate signals could be provided to control the LED circuit and the output circuit.

The disclosed self-calibrating current sensor 10, 210 monitors current in a load wire and indicates variation of the current level outside a preset range with normal operating current level at the center. In the illustrated embodiment, the range is fixed at 15% or 25% above and below the normal operating current. Status outside this range is indicated by an open contact, in range by a closed contact. The split core transformer 12 with a wound bobbin 14 of the device 10, 210 is clamped around a live wire from which the device 10, 210, via induced currents, derives its power and takes its readings. In one embodiment, the device 10, 210 is configured to automatically begin the calibration process upon initial power up (first time current flows through load wire). After thirty seconds the normal operating current will be read and stored. This stored value is the center of the range and the upper and lower 15% or 25% thresholds are calculated from this value. The choice of 15% or 25% is selected by a DIP switch (DIP 2) which can be selected and re-selected and does not affect the stored value. The value is stored in permanent memory; however, subsequent calibrations can be obtained by moving DIP 1 opposite of its current position. This can be done either with power applied to the load wire, or without.

The disclosed self-calibrating current sensor 10, 210 is configured to auto-calibrate once current begins flowing through the load wire to which the device is clamped if initiate calibration switch (DIP 1) has changed since the last power-up. This means that the installers hands are safely away from the live wire when power is applied. In a typical application the device monitors current flowing to a load and indicates if the current has gone outside a prescribed range. Current may go outside this range due to improper operation of the load or an improper variation of the operating voltage applied to the load.

Figure 4:
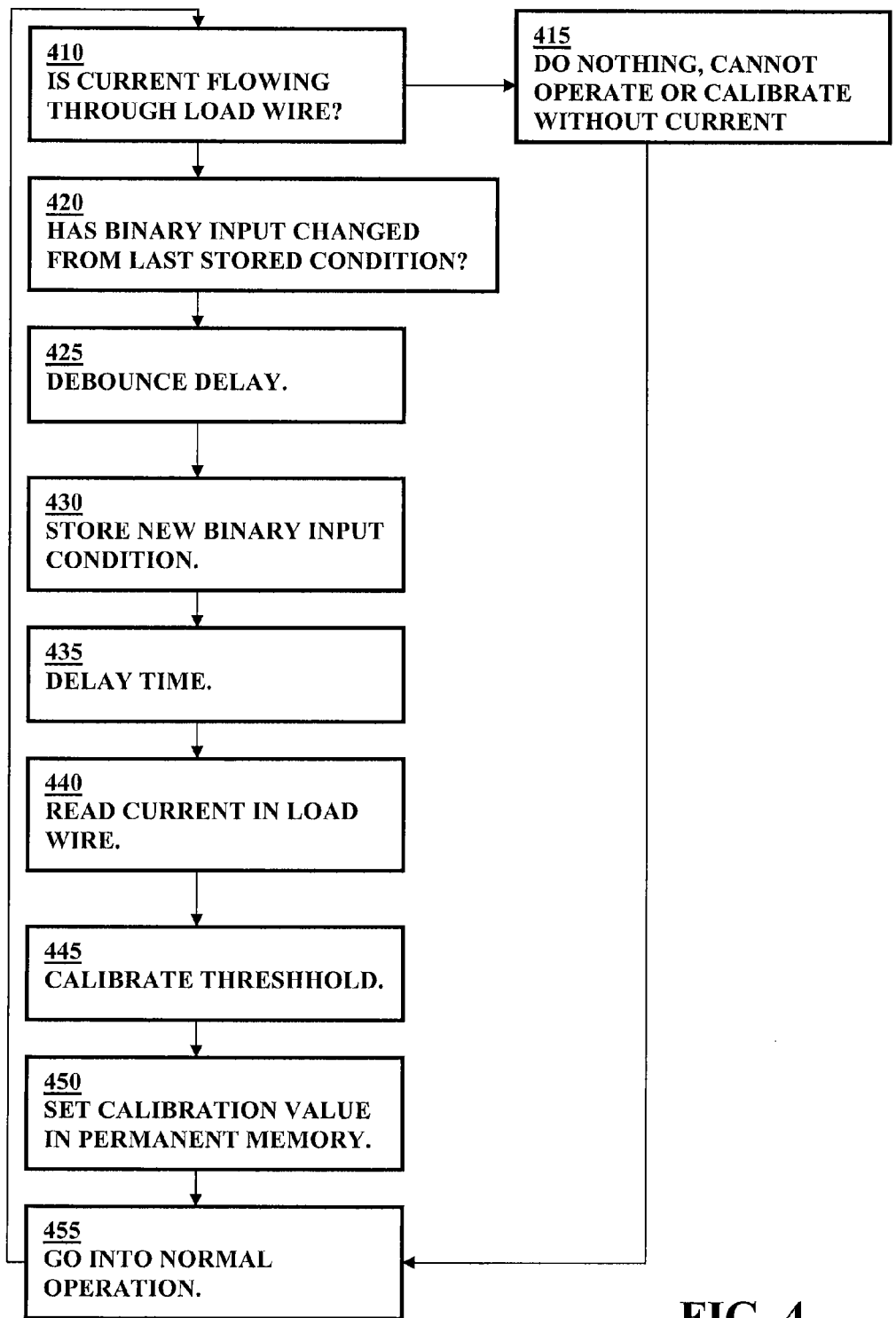
FIG. 4 is a flow diagram of the logic implemented by one embodiment of a self-calibrating current sensor.

FIG. 4 is a flow chart of the algorithm implemented by the self-calibrating current sensor. Initially a determination is made as to whether current is flowing through the load wire to which the split transformer with wound bobbin is clamped in Step 410. If not, in step 415 nothing is done since the self-calibrating current sensor is unable to operate or calibrate without current passing through the load wire to induce an operating current and generate a signal for sensing.

If it is determined in step 410 that current is passing through the load wire, it is then determined in step 420 whether the binary input has changed from the last stored condition. In one embodiment, this is determined by comparing a stored value of the binary input with the current value of the binary input. In an alternative embodiment, the change in state of the binary input causes a change in the signal value sent to the CalSel GP1 pin (pin 6) of the microcontroller integrated circuit (IC1) 82 triggering the micro controller to store a new value of the binary input and a sensed current signal. In the illustrated embodiment, flipping a dip switch changes the binary input and either adds or removes a resistor from a voltage divider causing an increase or decrease in the voltage that is buffered and output to the CalSel GP1 pin (pin 6) of the microcontroller integrated circuit (IC1) 82. If it is determined in step 420 that the binary input has not changed, then the self-calibrating current sensor initiates normal operation without recalibrating. If it is determined in step 420 that the binary input has changed, then a delay is debounced in step 425. The debouncing the delay step 425 may involve introducing a time delay before the value of the binary input is checked again to ensure that the change in state of the binary input was not caused by an anomaly or other unintentional change in state of the binary input. After a sufficient delay, if the binary input remains different from the prior stored value, the new binary input condition is stored in step 430.

Since the change in state of the binary input may occur during a powered down state and the system upon powering up may require some time to reach its operating conditions, a delay is implemented in step 435 prior to reading the current load in the wire in step 440. After reading the current in the load wire, the threshold is calibrated in step 445 and the calibration value is stored in permanent memory in step 450. The self-calibrating current sensor then initiates normal operation in step 455 providing one output signal when the sensed current is within the threshold range and a different signal when outside the threshold range either high or low.

In an alternative embodiment, where the digital input can be changed without powering down the system, such as by providing a digital input that can be safely changed without opening the motor starter cabinet, step 420 can be replaced with a step wherein it is determined whether a change in the binary input has been sensed. If not, the current sensor continues normal operation, but if so the algorithm proceeds immediately to step 435.

Although the invention has been described in detail with reference to certain preferred embodiments and specific examples, variations and modifications exist within the scope and spirit of the invention as described and as defined in the following claims.

What is claimed is:

1. A self-calibrating current sensor for sensing the state of the current passing through a load line enclosed within a housing, the self-calibrating current sensor comprising:

a sensor disposed adjacent the load line for sensing a current passing through the load line, the sensor having an output at which a signal indicative of the level of current passing through the load line is present, the sensor being positioned within the housing;

a binary input circuit configured to generate at least one binary signal, the binary input circuit being configured to change the level of the at least one binary signal without the need of opening the housing;

a controller circuit having a first input coupled to the output of the sensor for receiving the signal indicative of the level passing through the supply line and having a second input coupled to the binary input circuit for receiving the at least one binary signal, the controller being configured to provide a signal indicative of the status of the current in the load line on an output.

2. The device of claim 1 and further comprising an Alternating Current (AC) to Direct Current (DC) converter coupled to the output of the sensor for converting an AC signal present on the output of the sensor to a proportional DC voltage.

3. The device of claim 2 wherein the proportional DC voltage signal output by the AC to DC converter is read and stored by the controller circuit as the normal operating current in response to a change in the state of the at least one binary signal.

4. The device of claim 3 and further comprising a power circuit configured to provide a relatively steady DC voltage for driving components of the current sensor, the power circuit receiving the proportional DC voltage converted by the AC to DC converter.

5. The device of claim 3 wherein the controller circuit includes a microcontroller providing memory for storing values of the binary signal and the normal operating current.

6. The device of claim 5 wherein the controller circuit further comprises a clock circuit providing a clock signal to the microcontroller which clock signal is utilized to establish a debounce delay time which is utilized to determine whether any sensed change in the state of the at least one binary signal is unintentional.

7. The device of claim 5 and further comprising an amperage reading circuit coupled to the output of the AC to DC converter, the amperage reading circuit being configured to shift the level of the DC voltage output of the AC to DC converter to a lower proportional level that fits within the range of the microcontroller.

8. The device of claim 1 and further comprising a status indicator coupled to the output of the controller circuit for indicating the status of the current in the load line.

9. The device of claim 1 wherein the sensor comprises a transformer which is inductively coupled to the load line.

10. The device of claim 1 wherein the controller comprises a binary input circuit providing four levels of voltage.

11. The device of claim 10 wherein the binary input circuit comprises two Dual Inline Package (DIP) switches.

12. The device of claim 11 wherein one switch of the two DIP switches provides a signal to initiate a calibration sequence of the self-calibrating current sensor and the other of the two DIP switches provides a signal indicative of the range outside of which a fault signal is to be provided.

13. The device of claim 1 and further comprising a status LED circuit coupled to the output of the controller for providing a status indicator accessible from outside the housing without opening the housing.

* * * * *